United States Patent [19]

Huang et al.

[11] Patent Number: 4,465,980
[45] Date of Patent: Aug. 14, 1984

[54] PREDISTORTION CIRCUIT FOR A POWER AMPLIFIER

[75] Inventors: Ho-Chung Huang, Princeton Junction; Mahesh Kumar, Dayton; Franco N. Sechi, Princeton, all of N.J.

[73] Assignee: RCA Corporation, New York, N.Y.

[21] Appl. No.: 422,449

[22] Filed: Sep. 23, 1982

[51] Int. Cl.³ ............................................. H03F 1/32
[52] U.S. Cl. .................................... 330/149; 330/136; 330/277
[58] Field of Search ........................ 330/149, 136, 277

[56] References Cited

U.S. PATENT DOCUMENTS

| | | | |
|---|---|---|---|
| 2,999,986 | 9/1961 | Holbrook | 330/149 |
| 4,068,186 | 1/1978 | Sato et al. | 330/149 |
| 4,122,399 | 10/1978 | Heiter et al. | 330/149 |
| 4,141,023 | 2/1979 | Yamada | 357/23 |
| 4,241,316 | 12/1980 | Knapp | 330/277 |
| 4,283,684 | 8/1981 | Satoh | 330/277 |
| 4,291,277 | 9/1981 | Davis et al. | 330/149 |

OTHER PUBLICATIONS

Dual Gate GaAs M.E.S.F.E.T. Phase Shifter with Gain at 12 GHz, *Electronics Letters*, 3rd Jul. 1980, vol. 16, No. 14.

Dual-Gate Mesfet Variable-Gain Constant-Output Power Amplifier, *IEEE Transactions on Microwave Theory and Techniques*, vol. MTT-29, No. 3, Mar. 1981.

*Primary Examiner*—James B. Mullins
*Attorney, Agent, or Firm*—J. S. Tripoli; R. L. Troike; R. E. Smiley

[57] ABSTRACT

A predistortion circuit for a radio frequency power amplifier which has gain and phase shift characteristics that are non-linear as a function of power level of an RF input signal. The circuit includes a dual gate FET, with a drain coupled to the power amplifier. A modulated RF input signal is applied to an inductive matching network which is coupled to the signal gate of the FET. A modulating envelope detected version of the input signal is applied to a video amplifier which is coupled to the FET control gate. The signal applied to the control gate varies the gain of the FET as a function of input signal to compensate for the non-linear gain characteristic of the power amplifier and in conjunction with the matching network causes a phase change of the signal through the predistortion circuit to compensate for the non-linear phase characteristic of the power amplifier.

7 Claims, 3 Drawing Figures

PREDISTORTION CIRCUIT FOR A POWER AMPLIFIER

BACKGROUND OF THE INVENTION

This invention relates to predistortion circuits for radio frequency power amplifiers and particularly to such circuits incorporating dual gate FET's.

In communications systems involving power amplifiers there is typically distortion of both phase and gain in passing through the amplifier due to amplifier non-linearities. Such non-linearities cause intermodulation distortion which, in communications systems, is highly undesirable. Such power amplifiers producing typically a few watts of output power are usually traveling wave tube amplifiers (TWTA) or the newer solid state power amplifiers (SSPA). Of the two types of power amplifiers, the TWTA suffers from greater distortion. The inherent linearity of the SSPA, especially the GaAS field-effect transistor (FET) amplifier, is much better. Therefore the techniques for reducing distortion in SSPA's need not be as complex as the technique applicable to TWTA's.

An intermediate frequency predistortion technique for SSPA's has been reported in the article entitled "Complex Predistortion of High Frequency Signals", *Electronics Letters*, Vol. 9, p. 565, 1973.

The present invention relates to a radio frequency predistortion technique involving a dual gate FET. It is known to provide to the control gate of a dual gate FET a signal which is a function of an input signal applied to the signal gate of the FET to alter the gain of the FET as a function of input power so the FET produces constant output power in the milliwatt range regardless of the input power. Such a circuit is reported in an article entitled "Dual-Gate MESFET Variable-Gain, Constant-Output Power Amplifier" by M. Kumar and H. Huang, IEEE *Transactions on Microwave Theory and Techniques*, Vol. MTT-29, No. 3, March 1981, pp. 185-189.

More recently it has become known that the gain and phase of a dual gate FET can be controlled using a matching network having an inductive impedance at one of the gates of the dual-gate FET and applying a variable d.c. bias to the second gate of the dual-gate FET. This investigation is reported in an article entitled "Dual Gate GaAs M.E.S.F.E.T. Phase Shifter with Gain at 12 GHz," by C. Tsironis and P. Harrop, *Electronics Letters*, 3rd July 1980, Vol. 16, No. 14, pp. 553-554. In this investigation, however, the signal applied to the control gate of the FET is not related to the value of the input signal applied to the signal gate. The investigation did not involve connecting the output of the dual gate FET to a following circuit nor was it concerned with adjusting the gain of the dual gate FET using the control gate.

SUMMARY OF THE INVENTION

An RF predistortion circuit for an RF power amplifier which, as a function of the power level of an RF input signal, has non-linear gain and phase shift characteristics for a signal passing therethrough, comprises the combination of a circuit input terminal to which may be applied an RF input signal of time-varying power and a dual gate FET which has a first gate, a second gate, and a drain and source, one of which is coupled to the RF amplifier. The combination also includes an inductive matching network coupled between the circuit input terminal and first gate and means coupled between the circuit input terminal and second gate for applying to the second gate a signal which is a function of the power level of the input signal for varying the gain through the FET of the RF signal in response to the input signal to compensate for the non-linear gain characteristics of the RF amplifier. The combination of the inductive matching network and signal from the signal applying means varies the phase of the signal passing through the FET to compensate for the phase non-linearity in the RF amplifier.

DESCRIPTION OF THE PREFERRED EMBODIMENT

Figure 1:
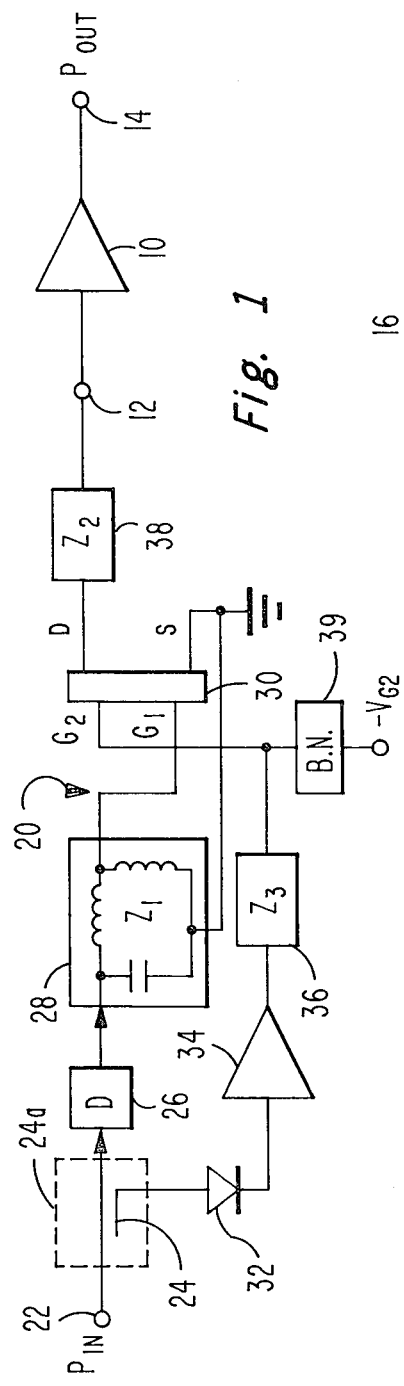
FIG. 1 is an RF predistortion circuit in electrical schematic and block diagram form for a power amplifier in accordance with a preferred embodiment of the instant invention.
Figure 3:
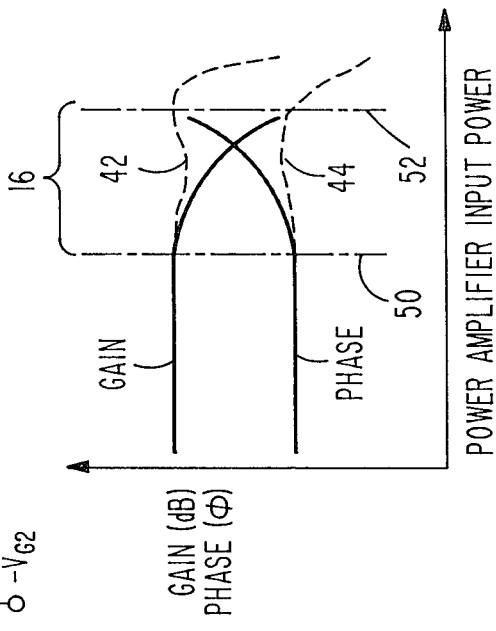
FIGS. 2 and 3 are sets of waveforms useful in understanding the operation of the FIG. 1 circuit.

In FIG. 1 amplifier 10 having an input terminal 12 and a system output terminal 14 may be a solid state power amplifier operating at gigahertz (GHz) frequencies as described in an article entitled "A 4-GHz GaAs FET Power Amplifier: An Advanced Transistor for Satellite Down Link Communication Systems," by B. Dornan, et al., *RCA Review*, Vol. 41, pp. 472-503, September 1980. Amplifier 10 typically has gain and phase shift characteristics as illustrated by the solid lines in FIG. 3. That is, the gain through amplifier 10 is desirably uniform for lower input power levels (those to the left of broken line 50 as illustrated in FIG. 3) and undesirably decreases as illustrated under bracket 16 for higher input power levels. Similarly, the phase shift through amplifier 10 is desirably uniform at low input power levels and undesirably increases at higher power levels again as indicated under bracket 16.

The distortion in amplifier 10 at levels of input power between lines 50 and 52 is compensated for by a predistortion circuit in accordance with the present invention as illustrated generally at 20 and comprising those components between system input terminal 22 and amplifier input terminal 12. System input terminal 22 to which may be applied a modulated input signal of carrier frequency typically from 2 to 20 GHz and of varying power is coupled via a directional coupler 24 as illustrated in block 24a to a delay 26. The delay 26, which may be a suitable length of transmission line, is coupled to an inductive matching circuit 28 which, in turn, is coupled to signal input gate G1 of a dual gate FET 30. Directional coupler 24 is coupled to an envelope detector 32 which removes the carrier of the signal applied at terminal 22. Detector 32 is coupled to a video amplifier 34. The output of video amplifier 34 is coupled to matching circuit 36 which, in turn, is coupled to the control gate G2 of dual gate FET 30. Gate G1 is the gate physically nearer to the source while gate G2 is the gate physically nearer to the drain of a dual gate FET. One of the drain and source of dual gate FET 30, typically the drain, is coupled to a suitable matching circuit 38 while the other of the source and drain is coupled to circuit ground. Matching circuit 38 is coupled to power amplifier input terminal 12.

The directional coupler 24 may be a conventional directional coupler such as manufactured by Narda Microwave Corporation, Plainview, N.Y. 11803. The purpose of delay 26 is to compensate for the longer delay in video amplifier 34 compared to delay through matching network 28 so that an input signal applied at a particular point in time to terminal 22 affects gates G1 and G2 simultaneously.

There are two purposes for inductive matching circuit 28. The first purpose is to match the signal applied at input terminal 22 to the impedance required by gate G1. The second purpose is to act in conjunction with the amount of bias voltage applied to gate G2 to induce in FET 30 a change in phase shift to compensate for the change in phase shift through amplifier 10, as described in the aforementioned article to C. Tsironis.

As also described in that article, for maximum control of phase shift through FET 30, a resonant matching circuit 36 is introduced between amplifier 34 and gate G2 of FET 30. In the instant case since the maximum change in phase shift through amplifier 10 to be compensated is on the order of 5°, the resonant circuit is not necessary.

The inductive and capacitive components illustrated within block 28 are illustrative only. Typically the values of the matching circuit 28 elements, their type and interconnection arrangement are empirically determined using known computer aided design techniques given the non-linearity parameters of amplifier 10.

Envelope detector 32 is of conventional design and typically may be a Schottky barrier diode. Video amplifier 34 is of the type which has a substantially uniform (flat) response to the maximum modulation frequency of the input signal thereto, has little or no output at low levels of input power below that represented by line 54, FIG. 2, with increasing amplitude in response to high levels of input power above that represented by line 54 as described in an article entitled "Dual-Gate MESFET Variable-Gain, Constant-Output Power Amplifier," by M. Kumar and H. Huang, *IEEE Transactions on Microwave Theory and Techniques*, Vol. MTT-29, No. 3, March 1981, pp. 185–189.

Figure 2:
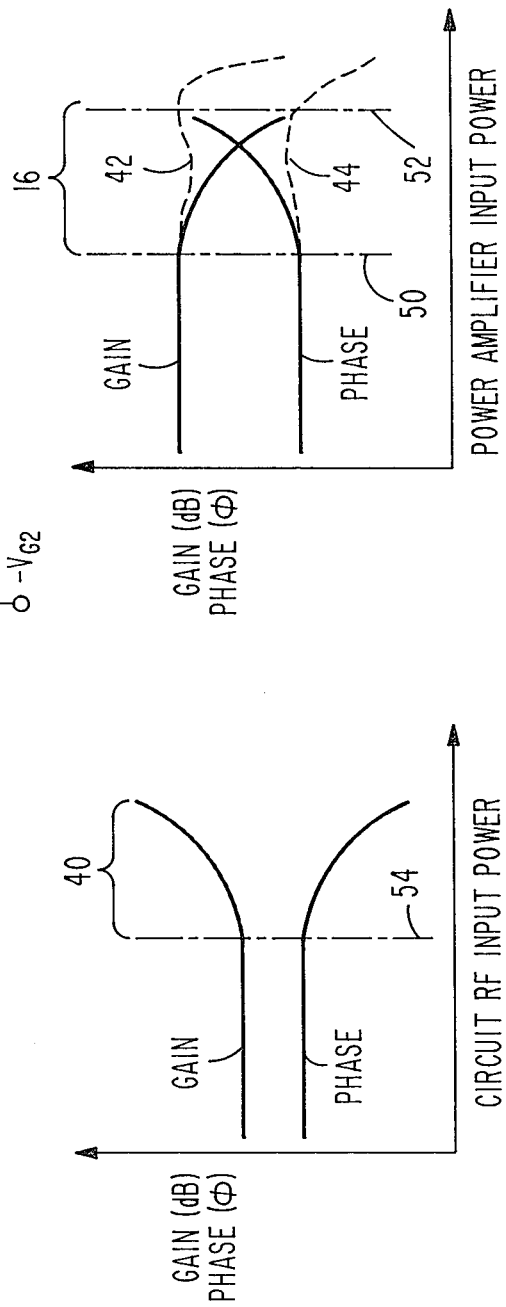

Although not shown in FIG. 1, appropriate bias networks and bias voltages are applied to the drain and gate G1 of FET 30. As is known, with a negative bias voltage $-V_{G2}$ applied via suitable bias network 39 to FET gate G2, the gain through FET 30 decreases relatively rapidly and, below some negative bias level, linearly with more negative bias voltages (for example, at 0 volts the gain is of the order of 10 dB; at $-3$ volts the gain is $-30$ dB) and increases relatively slowly and non-linearly with more positive bias voltages above 0 volts. For example, at $+2$ volts the gain is of the order of 12 dB. At even still higher values of gate G2 bias voltage the gain through FET 30 actually decreases with increased gate G2 bias voltage. Therefore, the proper operation of the circuit of FIG. 1 an appropriate negative fixed bias voltage $-V_{G2}$ such as $-1$ is applied to gate G2 so that when the bias voltage provided by amplifier 34 is added to that produced by the fixed bias the gain characteristics illustrated by the gain curve in FIG. 2 are achieved.

Dual gate FET 30 may typically be such as manufactured by NEC Ltd., California Eastern Lab., Inc., Santa Clara, Calif. Matching network 36 is designed to match the output impedance of amplifier 34 to the input impedance of gate G2. Matching network 38 is designed to match the output impedance at the drain of FET 30 relative to the input impedance of amplifier 10.

Operation of the circuit of FIG. 1 will be discussed in connection with the waveforms of FIGS. 2 and 3 as appropriate. It will be understood that the signal appearing at terminal 12 from RF predistortion circuit 20 as a function of the power of the input signal at terminal 22 is as shown in FIG. 2. That is, the gain through predistortion circuit 20 as a function of input power to terminal 22 is constant at the lower levels of input power (left of broken line 54 as illustrated in FIG. 2) and then increases with increasing input power at higher levels of input power as indicated beneath bracket 40. The constant gain (left of line 54) is due to the fact that, as previously mentioned, a negative fixed bias from source $V_{G2}$ is applied to gate G2 and to the fact that left of line 54 the output amplitude of amplifier 34 is negligible. In contrast, to the right of line 54, the output of amplifier 34 increases to thus offset the negative fixed gate G2 bias and cause the aforementioned increased gain through FET 30. The phase shift of signal passing from terminal 22 through circuit 20 to terminal 12 is constant at lower levels of input power because the gate 2 bias is fixed and decreases with increasing input signal at higher levels of input power as illustrated beneath bracket 40, FIG. 2 due to the combination of the particular component values of inductive matching network 28 and the change in the second gate bias voltage of the dual gate FET 30 caused by changes in voltage from amplifier 34 as discussed in the article by C. Tsironis et al. The change in bias voltage with increasing power below broken line 54 at 22 is too small to effect any change in gain or phase of the dual gate FET 30. However, for power above broken line 54, the voltage applied to gate G2 of FET 30 through the video amplifier 30 is sufficiently substantial to change the bias of the second gate of FET 30 and hence changes the gain and phase characteristics of the dual gate FET amplifier 30 as illustrated in FIG. 2.

The changing gain and phase characteristics with input power correspond to the change of gain and phase signals through amplifier 10. That is, the higher levels of input power to amplifier 10, those represented by curves under bracket 16, FIG. 3, correspond to the higher levels of RF input power at terminal 22, specifically power under bracket 40, FIG. 2.

With reference first to the gain curves of FIGS. 2 and 3, since the increased gain with power through FIG. 2 corresponds to the area of decreased gain with input power to amplifier 10, by a proper choice of gain characteristic the gain through the entire circuit from terminal 22 to terminal 14 can remain constant over an extended range relative to that without the predistortion circuit. The extended substantially constant gain is shown by the dotted line 42 in FIG. 3.

Similarly, looking at the phase waveforms in FIGS. 2 and 3, the decrease in phase with increasing power of the predistortion circuit is designed to offset the increasing phase with increasing power through amplifier 10 such as to extend the substantially flat response phase as illustrated by dotted line 44, FIG. 3. Thus, in the absence of predistortion circuit 20, the amplifier 10 could only be operated with an input power corresponding to broken line 50, FIG. 3 while with the addition of predistortion circuit 20, the area of linear operation of amplifier 10 can be extended to approximately broken line 52, FIG. 3.

What is claimed is:

1. An RF predistortion circuit for an RF power amplifier which, as a function of the power level of an RF input signal, has non-linear gain and phase shift characteristics for a signal passing therethrough, comprising in combination:
- a circuit input terminal to which may be applied an RF input signal of time-varying power;
- a dual gate FET including a first gate, a second gate, a drain and source, one of the latter two of which is coupled to said RF amplifier;
- an inductive matching network coupled between the circuit input terminal and first gate; and
- means coupled between the circuit input terminal and second gate for applying to said second gate a signal which is a function of the power level of said input signal for varying the gain through said FET of the RF signal in response to the input signal to compensate for the non-linear gain characteristics of said RF amplifier and wherein the combination of said inductive matching network and signal from the signal applying means varies the phase of the signal passing through said FET to compensate for said phase non-linearity in the RF amplifier.

2. The combination as set forth in claim 1 wherein said means for applying said second gate signal comprises means for deriving the modulating signal from said input signal and further comprises a video amplifier responsive to said modulating signal, the output of said video amplifier being coupled to said second gate.

3. The combination as set forth in claim 2 further including the series connection of a delay and said inductive matching network between said input terminal and said first gate.

4. The combination as set forth in claim 2 wherein said power amplifier is a solid state power amplifier.

5. The combination as set forth in claim 1 further including the series connection of a delay and said inductive matching network between said input terminal and said first gate.

6. The combination as set forth in claim 5 wherein said power amplifier is a solid state power amplifier.

7. The combination as set forth in claim 1 wherein said power amplifier is a solid state power amplifier.

* * * * *